(12) United States Patent
Kim et al.

(10) Patent No.: US 8,824,227 B2
(45) Date of Patent: Sep. 2, 2014

(54) PARALLEL TEST CIRCUIT AND METHOD OF SEMICONDUCTOR MEMORY APPARATUS

(75) Inventors: Bo Yeun Kim, Icheon-si (KR); Ji Eun Jang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/585,928

(22) Filed: Aug. 15, 2012

(65) Prior Publication Data

US 2013/0170305 A1    Jul. 4, 2013

(30) Foreign Application Priority Data

Dec. 28, 2011   (KR) .................. 10-2011-0144565

(51) Int. Cl.
  *G11C 29/26*    (2006.01)
(52) U.S. Cl.
  USPC ....... 365/201; 365/189.07; 365/200; 714/719
(58) Field of Classification Search
  USPC ..................... 365/189.07, 200, 201; 714/719
  See application file for complete search history.

(56) References Cited

U.S. PATENT DOCUMENTS

| | | | | |
|---|---|---|---|---|
| 5,936,901 | A | * | 8/1999 | Wong et al. .................. 365/201 |
| 5,959,911 | A | * | 9/1999 | Krause et al. ................ 365/201 |
| 6,484,289 | B1 | * | 11/2002 | Hsu .............................. 714/820 |
| 2007/0226553 | A1 | * | 9/2007 | Fekih-Romdhane et al. 714/718 |
| 2009/0037784 | A1 | * | 2/2009 | Kim et al. ..................... 714/719 |
| 2012/0173937 | A1 | * | 7/2012 | Do et al. ....................... 714/719 |

\* cited by examiner

*Primary Examiner* — Hoai V Ho
*Assistant Examiner* — Jay Radke
(74) *Attorney, Agent, or Firm* — William Park & Associates Ltd.

(57) ABSTRACT

A parallel test circuit of a semiconductor memory apparatus includes a memory bank which includes first and second sub banks having test global lines, respectively, and sharing a global line connected to each of the first and second sub banks. When a read command is applied during a test mode, the parallel test circuit compares data loaded in the global line to data loaded in the test global line of the second sub bank to attain a comparison result, compresses the comparison result to attain a compression signal, and outputs the compression signal as a test output signal to a pad.

14 Claims, 5 Drawing Sheets

PARALLEL TEST CIRCUIT AND METHOD OF SEMICONDUCTOR MEMORY APPARATUS

CROSS-REFERENCES TO RELATED APPLICATION

The present claims priority under 35 U.S.C. §119(a) to Korean application number 10-2011-0144565 filed on Dec. 28, 2011 in the Korean Intellectual Property Office, which is incorporated herein by reference in its entirety.

BACKGROUND

1. Technical Field

The present invention relates to a semiconductor memory apparatus, and more particularly, to a parallel test circuit and a method of performing parallel testing of semiconductor memory is apparatus.

2. Related Art

When fabricating a semiconductor memory apparatus, a test is performed to check whether a plurality of memory cells operate normally. The memory cell test may be performed at various levels, and are roughly divided into a test at a wafer level and a test at a package level.

At the wafer level, input/output terminals are exposed. Therefore, a plurality of memory banks may be simultaneously tested through a probe test. On the other hand, at the package level, memory cells may be accessed only through an input/output pad. Therefore, a plurality of memory banks may be sequentially tested.

FIG. 1 is a schematic block diagram illustrating the configuration of a conventional semiconductor memory apparatus.

The memory apparatus includes a plurality of memory banks and an input/output pad DQ<0:7> configured to input/output data stored in the memory banks. FIG. 1 representatively illustrates a first memory bank 100.

The first memory bank 100 is divided into a first sub bank 10 and a second sub bank 20, in order to efficiently store and access data. The first sub bank 10 and the second sub bank 20 are connected to the input/output pad DQ<0:7> through a global line GIO<0:63>. Since the first and second sub banks 10 and 20 are enabled at different timings during a normal operation, the first and second sub banks 10 and 20 may respectively process data through the shared global line GIO<0:63>. Furthermore, the first and second sub banks 10 and 20 may include test global lines TGIO0<0:63> and TGIO1<0:63>, respectively, which are used during a probe test. The test global lines TGIO0<0:63> and TGIO1<0:63> are provided in local areas of the respective sub banks, and are not connected to the input/output pad during packaging.

At the wafer level, the respective test global lines TGIO0<0:63> and TGIO1<0:63> may be probed to perform a memory cell test.

On the other hand, at the package level, memory cells may be accessed only through the input/output pad DQ<0:7>, and the sub banks share the global line GIO<0:63>. Therefore, a test should be performed for each sub bank sequentially. Therefore, at the package level, it takes a long time to perform a memory cell test.

SUMMARY

In one embodiment of the present invention, a parallel test circuit of a semiconductor memory apparatus includes a memory bank which includes first and second sub banks having test global lines, respectively, and sharing a global line connected to each of the first and second sub banks. When a read command is applied during a test mode, the parallel test circuit compares data loaded in the global line to data loaded in the test global line of the second sub bank to attain a comparison result, compresses the comparison result to attain a compression signal, and outputs the compression signal as a test output signal to a pad.

In another embodiment of the present invention, a parallel test circuit of a semiconductor memory apparatus includes: a first sub bank connected to a pad by a global line; a second sub bank connected to the global line, wherein the second sub bank is disconnected from the global line and connected to a test global line when a read command is applied during a test mode; a compression unit configured to compare data loaded in the global line to data loaded in the test global line and output a compression signal; and an output unit configured to generate a test output signal in response to the compression signal when a strobe signal is activated, and output the generated test output signal to the pad.

In another embodiment of the present invention, a parallel test method of a semiconductor memory apparatus includes the steps of: collectively writing data applied to a pad into first and second sub banks through a global line, when a write command is applied; transmitting the data stored in the first sub bank to the global line and transmitting the data stored in the second sub bank to a test global line, when a read command is applied; comparing the data loaded in the global line to the data loaded in the test global line to arrive at a comparison result, and compressing the comparison result to arrive at a compression signal; and outputting the compression signal as a test output signal to the pad when a strobe signal is activated.

BRIEF DESCRIPTION OF THE DRAWINGS

Features, aspects, and embodiments are described in conjunction with the attached drawings, in which.

DETAILED DESCRIPTION

Hereinafter, a parallel test circuit and method of a semiconductor memory apparatus according to the present invention will be described below with reference to the accompanying drawings through example embodiments.

Most memory cell failures in a semiconductor memory apparatus are single bit failures. When each single bit is sequentially tested to verify whether the single bit is defective or not, it is very inefficient in terms of test time and cost. Therefore, there is an increased need for a test circuit capable of checking whether a chip is defective within a short time. Accordingly, a multi-bit parallel test circuit has been developed. The multi-bit parallel test circuit preferentially writes the same data in all memory cells, reads the data stored in the memory cells all at once, and then compares the read data. Therefore, the multi-bit parallel test circuit may detect a failure when data that is read from a cell is different from the data that was written to the cell.

Figure 1:
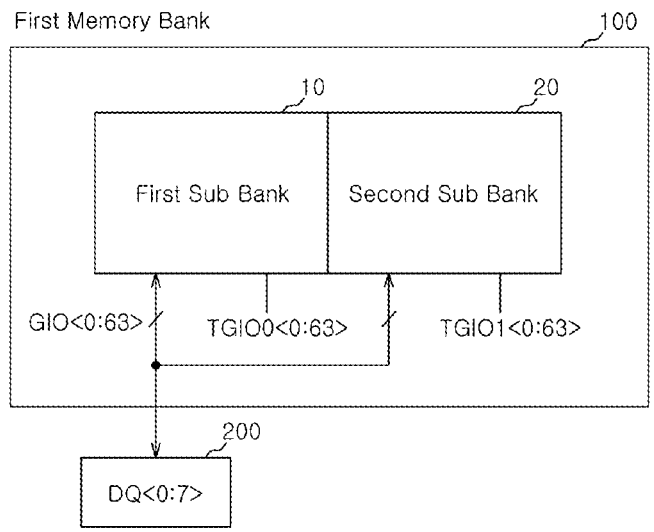
FIG. 1 is a schematic block diagram illustrating the configuration of a conventional semiconductor memory apparatus.
Figure 2:
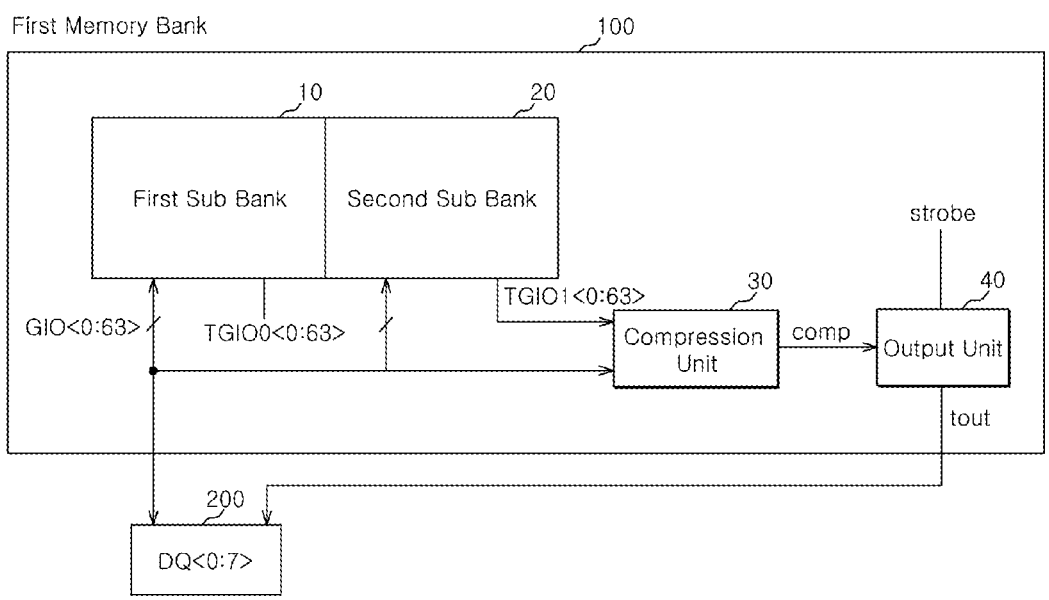
FIG. 2 is a block diagram illustrating a parallel test circuit of a semiconductor memory apparatus according to one embodiment of the present invention.

FIG. 2 is a block diagram illustrating a parallel test circuit of a semiconductor memory apparatus according to one embodiment of the present invention.

The semiconductor memory apparatus includes a plurality of memory banks and an input/output pad 200 (DQ<0:7>) configured to input/output data stored in the memory banks. The parallel test circuit of the semiconductor memory apparatus, illustrated in FIG. 2, representatively includes a first memory bank 100. Further, the first memory bank 100 comprises a first sub bank 10, a second sub bank 20, a compression unit 30, and an output unit 40.

The first and second sub banks 10 and 20 include test global lines TGIO0<0:63> and TGIO1<0:63>, respectively, which are used during a probe test as described above. The test global lines TGIO0<0:63> and TGIO1<0:63> are provided in local areas of the respective sub banks, and are not directly connected to the input/output pad DQ<0:7> during packaging.

Global lines GIO<0:63> are connected to the input/output pad DQ<0:7> and the first and second sub banks 10 and 20. The global lines GIO<0:63> serve as a data transfer path between the input/output pad DQ<0:7> and the respective sub banks during normal operation and are provided in a global area, unlike the test global lines TGIO0<0:63> and TGIO1<0:63>.

The parallel test circuit according to an embodiment of the present invention simultaneously tests the first and second sub banks 10 and 20 in parallel. During a test mode, when an operation of writing the same data is performed, the first and second sub banks 10 and 20 may both be enabled, and the same data may be written through the global lines GIO<0:63> to the first and second sub banks simultaneously.

On the other hand, an operation of simultaneously reading from the first and second sub banks 10 and 20 cannot be performed through the global lines GIO<0:63>. That is because the first and second sub banks 10 and 20 share the global lines GIO<0:63>, therefore, the data of the first and second sub banks 10 and 20 cannot be transmitted through the global lines GIO<0:63> at the same time.

Therefore, in this embodiment of the present invention, the test global lines of any one sub bank of the first and second sub banks 10 and 20, for example, the test global lines TGIO1<0:63> of is the second sub bank 20 may be used to read the respective sub bank while the first sub bank 10 is read. Accordingly, in an embodiment, the second sub bank 20 may be disconnected from the global lines GIO<0:63> and connected to the test global line TGIO1<0:63> when a read command is performed during a test mode.

The test global lines TGIO1<0:63> are provided in a local area. On the other hand, the global lines GIO<0:63> are provided in a global area. Therefore, when a data read operation is performed during the test mode, the data of the first sub bank 10 that is loaded in the global lines GIO<0:63> and the data of the second sub bank 20 that is loaded in the test global lines TGIO1<0:63> may be compressed inside the local area of the second sub bank 20.

During the test mode, when transmitting the data the second sub bank 20 is configured to load data stored therein into the test global lines TGIO1<0:63> instead of the global lines GIO<0:63>. The detailed configuration thereof is illustrated in FIG. 2.

Referring to FIG. 2, during normal operation, the second sub bank 20 drives data to the global lines GIO<0:63> from local lines LIO<0:63> provided within the second sub bank. During the test mode, however, the second sub bank 20 drives data to the test global lines TGIO1<0:63> from the local lines LIO<0:63>.

Figure 3:
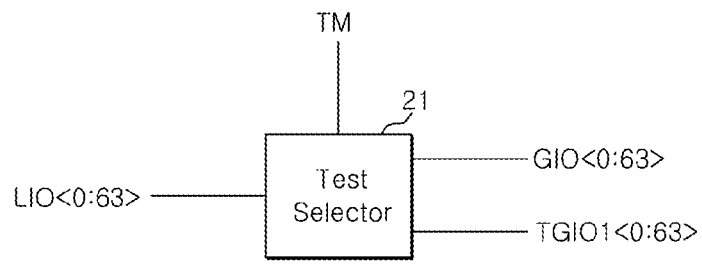
FIG. 3 is a block diagram illustrating a second sub bank of FIG. 2.

Specifically, the second sub bank 20 includes a test selector 21 (see FIG. 3). The test selector 21 is configured to select a driving line in response to a test mode signal TM, when driving data from the local lines LIO<0:63> during a read operation. That is, the test selector 21 drives the global lines GIO<0:63> when a deactivated test mode signal TM is applied to the test selector 21, and the test selector 21 drives the test global lines TGIO1<0:63> when an activated test mode signal TM is applied to the test selector 21.

Therefore, in the test mode, when read operations for the first and second sub banks 10 and 20 are simultaneously performed, data stored in memory cells of the first sub bank 10 are loaded into the global lines GIO<0:63>, and data stored in memory cells of the second sub bank 20 are loaded into the test global lines TGIO1<0:63>. This configuration may be reversed.

The compression unit 30 is configured to compare and compress the data loaded in the global lines GIO<0:63> and the test global lines TGIO1<0:63>, and output the result as a compression signal COMP.

The compression unit 30 determines whether the data loaded in the global lines GIO<0:63> are identical, i.e., equal to the data loaded in the test global lines TGIO1<0:63> in a corresponding order. The result of determining whether the data loaded in the global lines GIO<0:63> are identical to the data loaded in the test global lines TGIO1<0:63> may be a comparison result. Then, the compression unit 30 compresses the comparison result to output the compression signal COMP. The comparison and compression operation is performed in a state where the global lines GIO<0:63> and the test global lines TGIO1<0:63>, respectively, are divided into a plurality of octets, and compression results of the respective octets is are then recompressed. The detailed configuration thereof will be described below.

The output unit 40 is configured to output a test output signal TOUT to the input/output pad DQ<0:7> in response to a strobe signal STROBE and the compression signal COMP. The output unit 40 is a kind of driver. When the strobe signal STROBE is applied, the output unit 40 outputs the test output signal TOUT according to the level of the compression signal COMP.

Figure 4:
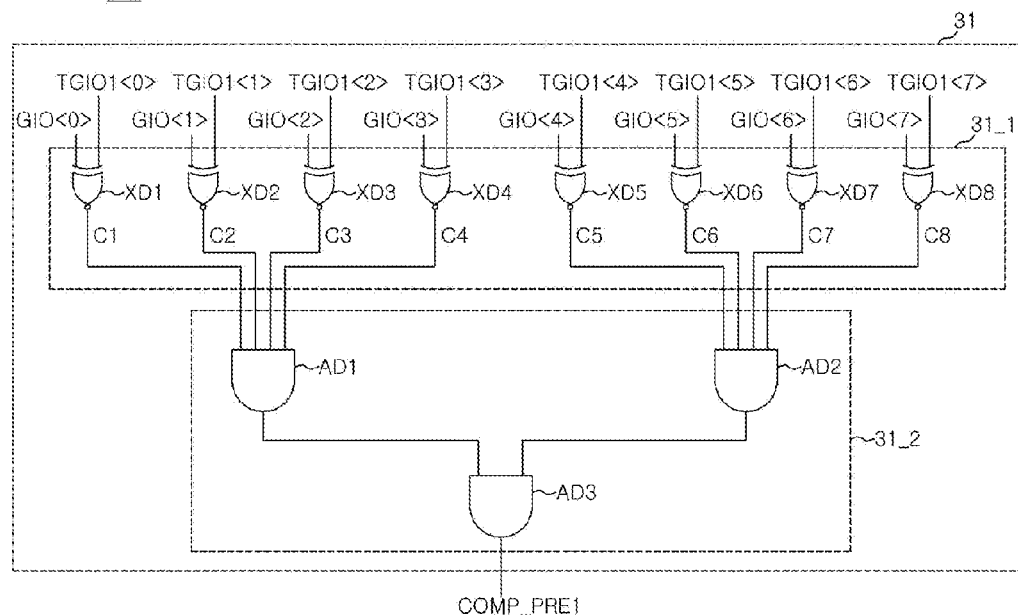
FIG. 4 is a circuit diagram illustrating a compression unit of FIG. 2.
Figure 4:
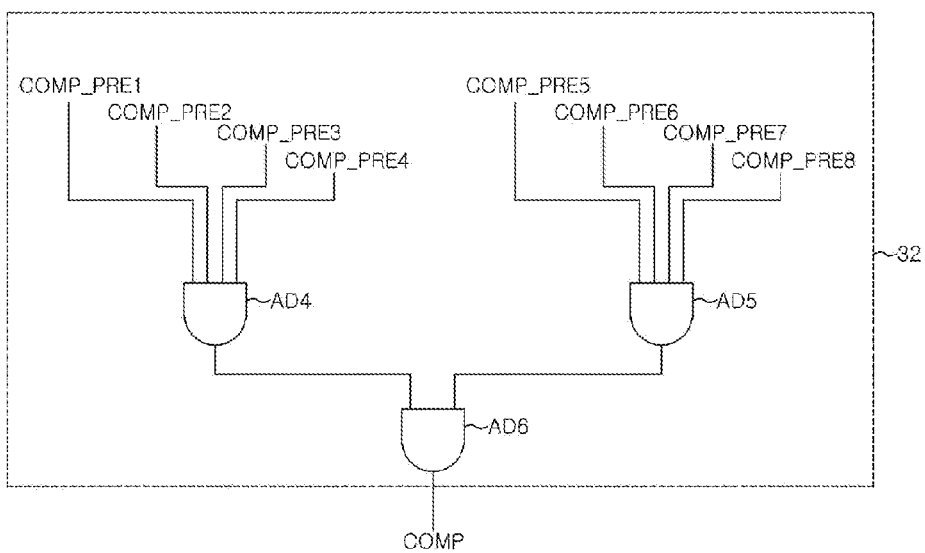

FIG. 4 is a circuit diagram of the compression unit 30.

The compression unit 30 includes a plurality of first compressors 31 and a second compressor 32.

Each of the first compressors 31 is configured to compare data for each octet of the global lines GIO<0:63> and the test global lines TGIO1<0:63> to arrive at comparison results C1 to C8, compress comparison results C1 to C8, and output a compression result COMP_PRE1 to COMP_PRE8.

The second compressor 32 is configured to compress the compression results COMP_PRE1 to COMP_PRE8 for the respective octets and generate the compression signal COMP.

The global lines GIO<0:63> and the test global lines TGIO1<0:63> respectively include a plurality of octets. In this embodiment of the present invention, since the global lines GIO<0:63> and the test global lines TGIO1<0:63> include 64 lines, respectively, data from each of the lines GIO<0:63> and TGIO1<0:63> may be divided into eight octets. When compressing the data read from the first and second sub banks 10 and 20, the compression unit 30 first compresses data loaded in the respective octets, and then recompresses the results.

FIG. 4 illustrates only one first compressor 31 related to one octet, but the compression unit 30 includes eight first compressors 31 having a substantially similar configuration.

The first compressor 31 for one octet of data, illustrated in FIG. 4, includes a comparison section 31_1 and an AND operation section 31_2.

The comparison section 31_1 includes eight identity gates XD1 to XD8 configured to compare data loaded in the global lines GIO<0:7> to data loaded in the test global lines TGIO1<0:7> in a corresponding order. The identity gates XD1 to XD8 may be XNOR gates configured to output a high level when data have a same value are inputted to the identity gate XD1 to XD8, and output a low level when different data are inputted. The comparison section 31_1 compares data through the identity gates XD1 to XD8, and outputs eight comparison signals C1 to C8.

The AND operation section 31_2 is configured to compress the eight comparison signals C1 to C8. Referring to FIG. 4, the AND operation section 31_2 compresses the first to fourth comparison signals C1 to C4 using a first AND gate AD1, and compresses the fifth to eighth compression signals C5 to C8 using a second AND gate AD2. The AND operation section 31_2 also compresses output signals of the first and second AND gates AD1 and AD2 using a third AND gate AD3.

In one example, the first compressor 31 may compare an octet of data of the global lines, for example GIO<0:7>, with an octet of data of test global lines, for example TGIO1<0:7>. In particular, the comparison section 31_1 may compare TGIO1<0> with GIO<0>, TGIO1<1> with GIO<1>, ..., and TGIO1<7> with GIO<7>. When all the data of a compared octet that is inputted to the first compressor 31 are the same, the compression result COMP_PRE1 activated to a high level is generated. However, when any one of the compared data, is not the same, the compression result COMP_PRE1 deactivated to a low level is generated. That is, when the activated compression result COMP_PRE1 is generated, it means that all the memory cells of the first and second sub banks 10 and 20 having transferred the data are normal, and when the deactivated compression result COMP_PRE1 is generated, it means that a specific memory cell is not normal. That is, if a memory cell is not normal, the memory cell may have suffered a failure, in other words, the memory cell may be defective.

A plurality of compression results corresponding to the number of compared octets is generated. In this embodiment of the present invention, because there may be 64 global lines GIO<0:63> and 64 test global lines TGIO1<0:63> whose output may divided into eight octets of data, eight compression results COMP_PRE1 to COMP_PRE8 are generated.

The second compressor 32 compresses the eight compression results COMP_PRE1 to COMP_PRE8 generated in such a manner. Referring to FIG. 4, the second compressor 32 compresses the first to fourth compression results COMP_PRE1 to COMP_PRE4 using a fourth AND gate AD4, and compresses the fifth to eighth compression results COMP_PRE5 to COMP_PRE8 using a fifth AND gate AD5. Furthermore, the second compressor 32 compresses output signals of the fourth and fifth AND gates AD4 and AD5 using a sixth AND gate AD6.

Therefore, when all the compression results COMP_PRE1 to COMP_PRE8 of the respective octets are activated to a high level, the second compressor 32 outputs the compression signal COMP activated to a high level. However, when any one of the compression results COMP_PRE1 to COMP_PRE8 is deactivated, the second compressor 32 outputs the compression signal COMP deactivated to a low level. That is, when the activated compression signal COMP is outputted, it means that all memory cells are normal, and when the deactivated compression signal COMP is outputted, it means that a specific memory cell is not normal.

Figure 5:
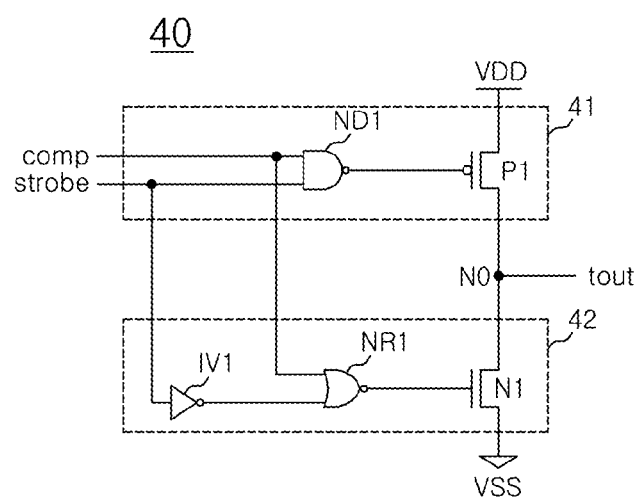
FIG. 5 is a circuit diagram illustrating a output unit of FIG. 2.

FIG. 5 is a circuit diagram of the output unit 40.

The output unit 40 is a kind of driver, and is configured to generate the activated test output signal TOUT when the activated compression signal COMP is applied if the strobe signal STROBE is activated. On the other hand, when the deactivated compression signal COMP is applied if the strobe signal STROBE is activated, the output unit 40 generates the deactivated test output signal TOUT.

The output unit 40 includes a pull-up driver 41 and a pull-down driver 42.

The pull-up driver 41 is configured to apply an external voltage VDD to an output node NO when the activated compression signal COMP is inputted to the pull-up driver 41 and the strobe signal STROBE is activated.

Specifically, the pull-up driver 41 includes a first NAND gate ND1 and a first PMOS transistor P1. The first NAND gate ND1 is configured to receive the strobe signal STROBE and the compression signal COMP and perform a NAND operation on the received signals. The first PMOS transistor P1 is configured to apply the external voltage VDD to the output node NO in response to an output signal of the first NAND gate ND1.

The pull-down driver 42 is configured to apply a ground voltage VSS to the output node NO when the deactivated compression signal COMP is inputted to the pull-down driver 42 and if the strobe signal STROBE is activated.

Specifically, the pull-down driver 42 includes a first inverter IV1, a first NOR gate NR1, and a first NMOS transistor N1. The first NOR gate NR1 is configured to receive the strobe signal STROBE and invert the strobe signal STROBE through the first inverter IV1, and perform a NOR operation on the received signals. The first NMOS transistor N1 is configured to apply the ground voltage VSS to the output node NO in response to an output signal of the first NOR gate NR1.

Figure 6:
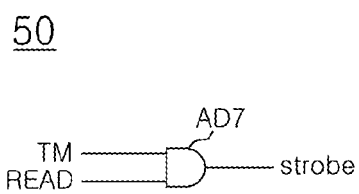
FIG. 6 is a circuit diagram illustrating a strobe signal generation unit.

The strobe signal STROBE applied to the output unit 40 is a signal which is applied to output the test output signal TOUT during a test mode. FIG. 6 illustrates a strobe signal generation unit 50 that may generate the strobe signal STROBE.

Referring to FIG. 6, the strobe signal generation unit 50 includes a seventh AND gate AD7 configured to receive the test mode signal TM and a read command signal READ and generate the activated strobe signal STROBE when the read command is performed during the test mode.

That is, the strobe signal STROBE is activated when the same data are written into the first and second banks 10 and 20 and then read to detect a failed memory cell, during the test mode.

Operations of the pull-up driver 41 and the pull-down driver 42 are performed as follows.

Suppose that the output node NO is reset to a low level. When the strobe signal STROBE is deactivated, an output of the first NAND gate ND1 is at a high level. Thus, the first PMOS transistor P1 is turned off. Furthermore, since an output of the first NOR gate NR1 is at a low level, the first NMOS transistor N1 is also turned off. Therefore, the voltage level of the output node NO is maintained, and the test output signal TOUT is generated at a low level.

On the other hand, when the strobe signal STROBE is activated, the operation may differ depending on the state of the compression signal COMP.

First, when the strobe signal STROBE is activated and the compression signal COMP is activated, the first NAND gate ND1 outputs a low level. Thus, the first PMOS transistor P1 is turned on. Therefore, the external voltage VDD is applied to the output node NO to output the test output signal TOUT activated to a high level.

On the other hand, when the strobe signal STROBE is activated and the compression signal COMP is deactivated, the second NOR gate NR1 outputs a high level. Thus, the first NMOS transistor N1 is turned on. Therefore, the ground voltage VSS is applied to the output node NO to output the test output signal TOUT deactivated to a low level.

That is, in test mode when the read operation is performed, when all the memory cells are normal, the test output signal TOUT activated to a high level is outputted. However, when any one of the memory cells is not normal, the test output signal TOUT deactivated to a low level is outputted. The test output signal TOUT is transferred externally through the input/output pad DQ<0:7>. Based on the test output signal TOUT, it is possible to determine whether all the memory cells are normal, or whether the first memory bank 100 includes a defective cell.

Figure 7:
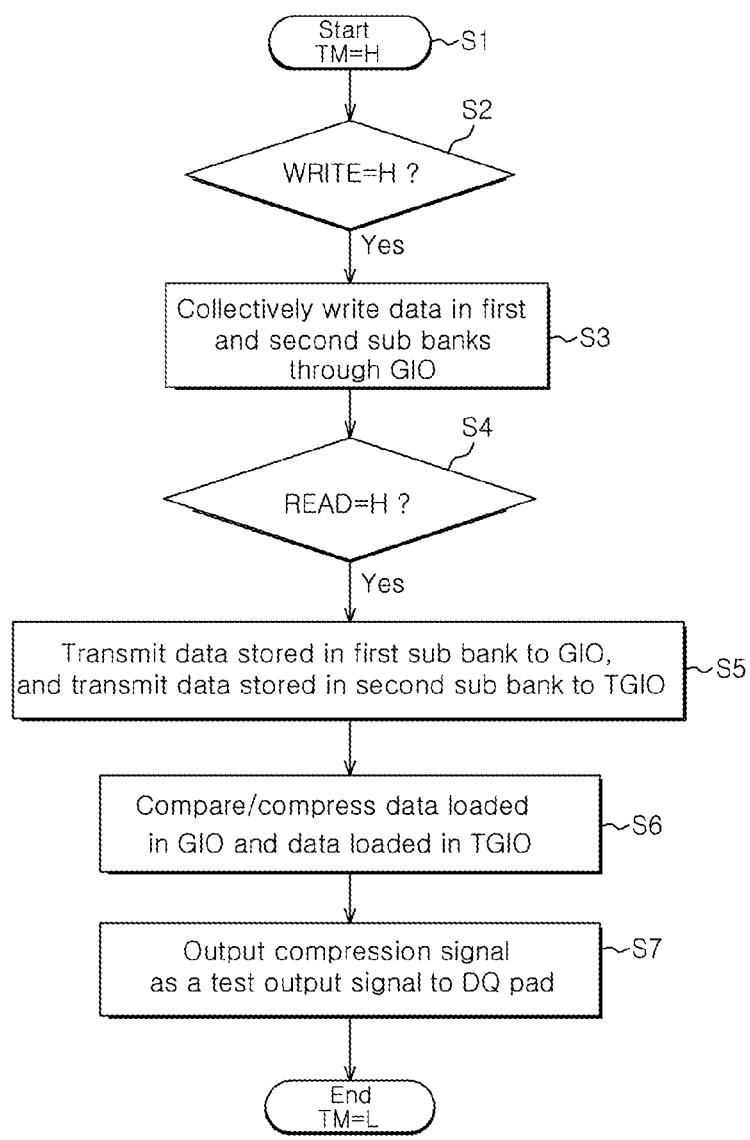
FIG. 7 is an algorithm showing a parallel test method of a semiconductor memory apparatus according to another embodiment of the present invention.

FIG. 7 is an algorithm showing a parallel test method of a semiconductor memory apparatus according to another embodiment of the present invention.

In the parallel test method, the same data are preferentially written into the first and second memory sub banks 10 and 20. Then, the data stored in the respective memory sub banks are read and is compared with each other. Therefore, when data having a different state is read, a failed memory cell may exist in at least one of the first or second memory sub banks 10 and 20.

Specifically, the parallel test method is performed as follows.

First, in order to perform a parallel test on the semiconductor memory apparatus, a test mode signal TM is activated to a high level at step S1. When the activated write command WRITE is applied to the first memory bank at step S2, data applied to an input/output pad DQ are collectively written into first and second sub banks through a global line GIO at step S3.

When a read command READ activated to a high level is applied to the first memory bank at step S4 after the write operation, the data stored in the first sub bank is transmitted to the global line GIO, and the data stored in the second sub bank is transmitted to a test global line TGIO at step S5. Then, the data loaded in the global line GIO and the data loaded in the test global line TGIO are compared and compressed at step S6. The compression signal is outputted as the test output signal to the input/output pad DQ<0:7> at step S7.

At the step S6, when the data loaded in the global line GIO and the data loaded in the test global line TGIO are equal, the activated compression result is generated. When, however, the data loaded in the global line GIO and the data loaded in the test global line TGIO are not equal, the deactivated compression result is generated. That is, when all the memory cells of the first and second is sub banks where the write/read operation was performed are normal, the activated compression result is generated, and when any one of the memory cells is not normal, the deactivated compression result is generated. The data loaded in the global line GIO may be equal to the data loaded in the test global line TGIO when there are no defective memory cells in the first and second sub banks. The compression result may be further compressed to arrive at a compression signal COMP. As previously described, the test output signal TOUT may be activated or deactivated based on the compression signal COMP and the strobe signal STROBE, where the strobe signal STROBE is activated or deactivated based on whether the system is in test mode and whether a read operation is being performed. The result of the compression is outputted to the input/output pad DQ at step S7 through the test output signal TOUT. Thus, through the test output signal TOUT outputted through the input/output pad DQ, it is possible to determine whether the memory cells of the first and second sub banks are normal or not.

While certain embodiments have been described above, it will be understood to those skilled in the art that the embodiments described are by way of example only. Accordingly, the parallel test circuit and method described herein should not be limited based on the described embodiments. Rather, the parallel test circuit and method described herein should only be limited in light of the claims that follow when taken in conjunction with the above description and accompanying drawings.

What is claimed is:

1. A parallel test circuit of a semiconductor memory apparatus, comprising:
    a memory bank which includes first and second sub banks having test global lines—and sharing a global line,
    wherein, when a read command is applied during a test mode, the parallel test circuit compares data loaded in the global line with data loaded in the test global line of the second sub bank to attain a comparison result, compresses the comparison result to attain a compression signal, and outputs the compression signal as a test output signal to a pad,
    wherein the first and second sub banks are both enabled during the test mode,
    wherein the global line and the test global line of the second sub bank respectively comprise a plurality of lines, and the parallel test circuit further comprises:
        a compression unit configured to compare data loaded in the plurality of global lines and data loaded in the plurality of global test lines of the second sub bank, compress the comparison result, and output a compression signal based on a compression result; and
        an output unit configured to generate the test output signal in response to a strobe signal and the compression signal, and output the generated test output signal to the pad, and
    wherein the compression unit outputs an activated compression signal when the data loaded in the global lines are equal to the data loaded in the test global lines of the second sub bank.

2. The parallel test circuit according to claim 1, wherein the strobe signal is activated when the read command is applied during the test mode.

3. The parallel test circuit according to claim 2, wherein the output unit generates an activated test output signal when an activated compression signal is applied when the strobe signal activated.

4. The parallel test circuit according to claim 3, wherein the output unit comprises:
    a pull-up driver configured to apply an external voltage to an output node when the activated compression signal is applied if the strobe signal is activated; and
    a pull-down driver configured to apply a ground voltage to the output node when a deactivated compression signal is applied if the strobe signal is activated.

5. A parallel test circuit of a semiconductor memory apparatus, comprising:
  a first sub bank connected to a pad by a global line;
  a second sub bank connected to the global line in common with the first sub bank, wherein the second sub bank is connected to the global line during a normal operation and connected to a test global line when a read command is applied during a test mode;
  a compression unit configured to compare data loaded in the global line to data loaded in the test global line and output a compression signal; and
  an output unit configured to generate a test output signal in response to the compression signal when a strobe signal is activated, and output the generated test output signal to the pad,
  wherein the first and second sub banks are both enabled during the test mode, and
  wherein the global line and the test global line respectively comprise a plurality of octets, and
  when a read command is applied during the test mode, the data is simultaneously loaded into the global line and the test global line comprising the plurality of octets.

6. The parallel test circuit according to claim 5, wherein the compression unit comprises: a plurality of first compressors configured to divide the global line and the test global line into the plurality of octets, compare and compress the data loaded in the respective octets, and output a plurality of compression results; and a second compressor configured to receive the plurality of compression results and generate the compression signal.

7. The parallel test circuit according to claim 6, wherein each of the first compressors for each octet comprises:
  a plurality of comparison sections configured to generate activated comparison signals, respectively, when the data are equal; and
  an AND operation section configured to output an activated compression result when all of the comparison signals are activated.

8. The parallel test circuit according to claim 3, wherein the second compressor generates the activated compression signal when the plurality of compression results for the respective octets are all activated.

9. The parallel test circuit according to claim 5, wherein the strobe signal is activated when the read command is applied during the test mode.

10. The parallel test circuit according to claim 9, wherein the output unit outputs an activated test output signal to an output node when the activated compression signal is applied when the strobe signal is activated.

11. The parallel test circuit according to claim 10, wherein the output unit comprises:
  a first pull-up driver configured to apply an external voltage to the output node when an activated compression signal is applied when the strobe signal is activated; and
  a pull-down driver configured to apply a ground voltage to the output node when a deactivated compression signal is applied when the strobe signal is activated.

12. The parallel test circuit according to claim 11, wherein the pull-up driver comprises:
  a first NAND gate configured to receive the strobe signal and the compression signal; and
  a first PMOS transistor configured to apply the external voltage to the output node in response to an output signal of the first NAND gate.

13. The parallel test circuit according to claim 11, wherein the pull-down driver comprises:
  a first NOR gate configured to receive the inverted strobe signal and the compression signal; and
  a first NMOS transistor configured to apply the ground voltage to the output node in response to an output signal of the first NOR gate.

14. A parallel test method of a semiconductor memory apparatus, comprising the steps of:
  collectively writing data applied to a pad into first and second sub banks through a global line, when a write command is applied;
  transmitting the data stored in the first sub bank to the global line and transmitting the data stored in the second sub bank to a test global line, when a read command is applied;
  comparing the data loaded in the global line to the data loaded in the test global line to arrive at a comparison result, and compressing the comparison result to arrive at a compression signal; and
  outputting the compression signal as a test output signal to the pad when a strobe signal is activated,
  wherein the global line is connected to the first and second sub banks in common, and
  wherein, in the step of comparing the data loaded in the global line to the data loaded in the test global line,
  when the data loaded in the global line to the data loaded in the test global line are equal, an activated compression signal is generated.

* * * * *